(12) United States Patent
Guzek

(10) Patent No.: US 8,264,849 B2
(45) Date of Patent: Sep. 11, 2012

(54) MOLD COMPOUNDS IN IMPROVED EMBEDDED-DIE CORELESS SUBSTRATES, AND PROCESSES OF FORMING SAME

(75) Inventor: John S. Guzek, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 198 days.

(21) Appl. No.: 12/821,847

(22) Filed: Jun. 23, 2010

(65) Prior Publication Data

US 2011/0317383 A1 Dec. 29, 2011

(51) Int. Cl.
*H05K 1/18* (2006.01)
*H01L 23/02* (2006.01)

(52) U.S. Cl. ........ 361/764; 361/761; 361/762; 257/686; 257/698; 257/737; 257/773; 438/106; 438/109; 438/110; 438/121; 438/122; 438/125; 29/825; 29/841; 29/846

(58) Field of Classification Search .......... 361/760–767, 361/772–775, 792–795, 719–722, 807–809; 174/254–267; 29/825–852; 438/106–118, 438/121–126; 257/686, 690, 698, 706–718, 257/737–739, 723, 773, 789, 777–779, 782, 257/659, E21.499–508

See application file for complete search history.

(56) References Cited

U.S. PATENT DOCUMENTS

| | | | |
|---|---|---|---|
| 6,989,593 B2* | 1/2006 | Khan et al. | 257/707 |
| 7,591,067 B2* | 9/2009 | Wang | 29/832 |
| 2007/0155057 A1* | 7/2007 | Wang | 438/122 |
| 2008/0290507 A1* | 11/2008 | Park et al. | 257/717 |
| 2011/0156231 A1 | 6/2011 | Guzek | |
| 2011/0215464 A1* | 9/2011 | Guzek et al. | 257/737 |
| 2011/0228464 A1* | 9/2011 | Guzek et al. | 361/679.31 |
| 2011/0241195 A1* | 10/2011 | Nalla et al. | 257/690 |
| 2011/0301492 A1* | 12/2011 | Lamp | 600/547 |

* cited by examiner

*Primary Examiner* — Michael V Datskovskiy
(74) *Attorney, Agent, or Firm* — Winkle, PLLC

(57) ABSTRACT

An apparatus includes a coreless substrate with an embedded die that is integral to the coreless substrate, and at least one device assembled on a surface that is opposite to a ball-grid array disposed on the coreless substrate. The apparatus include an at least one stiffener layer that is integral to the coreless substrate and the stiffener layer is made of overmold material, underfill material, or prepreg material.

29 Claims, 9 Drawing Sheets

MOLD COMPOUNDS IN IMPROVED EMBEDDED-DIE CORELESS SUBSTRATES, AND PROCESSES OF FORMING SAME

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1A:
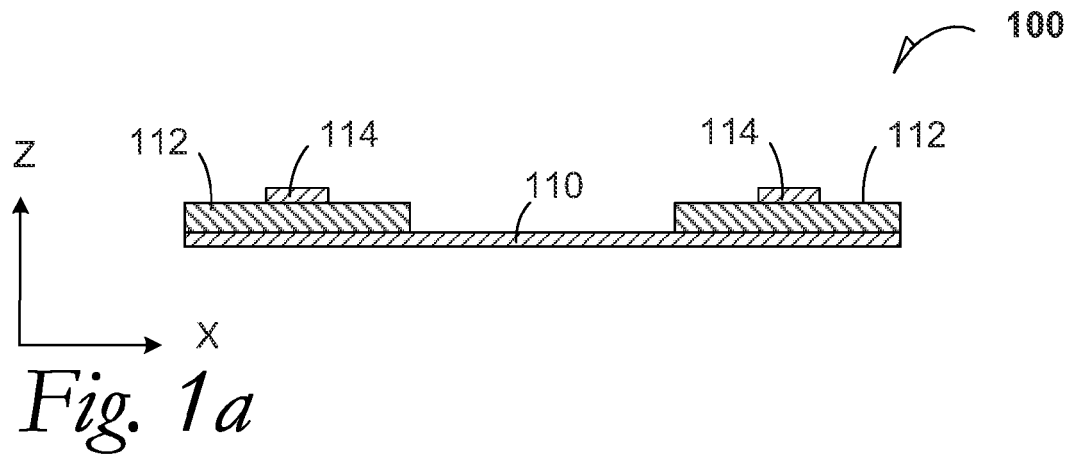
FIG. 1a is a cross-section elevation of an embedded-die coreless-substrate apparatus during processing according to an example embodiment.

FIG. 1a is a cross-section elevation of an embedded-die coreless-substrate apparatus 100 during processing according to an example embodiment. An etch-stop layer 110 is provided with a copper connector pad 112 disposed thereupon. A contact pad 114 is disposed on the copper connector pad 112. In an embodiment, the contact pad 114 is a more electronegatively noble metal than the copper connector pad 112. In an embodiment, the contact pad 114 is a more noble metal than the copper connector pad 112 such as a nickel-gold (NiAu) alloy.

Figure 1B:
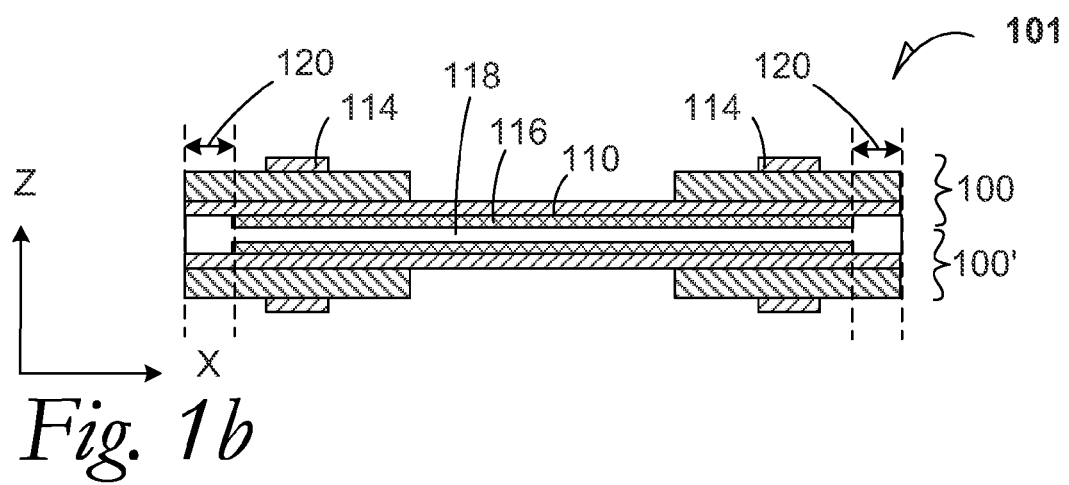
FIG. 1b is a cross-section elevation of the apparatus depicted in FIG. 1a after further processing according to an embodiment.

FIG. 1b is a cross-section elevation of the apparatus depicted in FIG. 1a after further processing according to an embodiment. The apparatus 101 has been enlarged by back-to-back mating the original apparatus 100 to a similar apparatus 100'. Consequently, processing throughput is doubled. Description of the apparatus 100 and 100' may be referred to by reference numerals ascribed to the apparatus 100, but it may be understood that duplicate processing and structures are contained in the apparatus 100'.

The apparatus 101 includes an adhesion release layer 116 and an adhesive binder 118. A cutting zone 120 is provided at each end of the apparatus 101 in the X-dimension for separation processing as illustrated further.

Figure 1C:
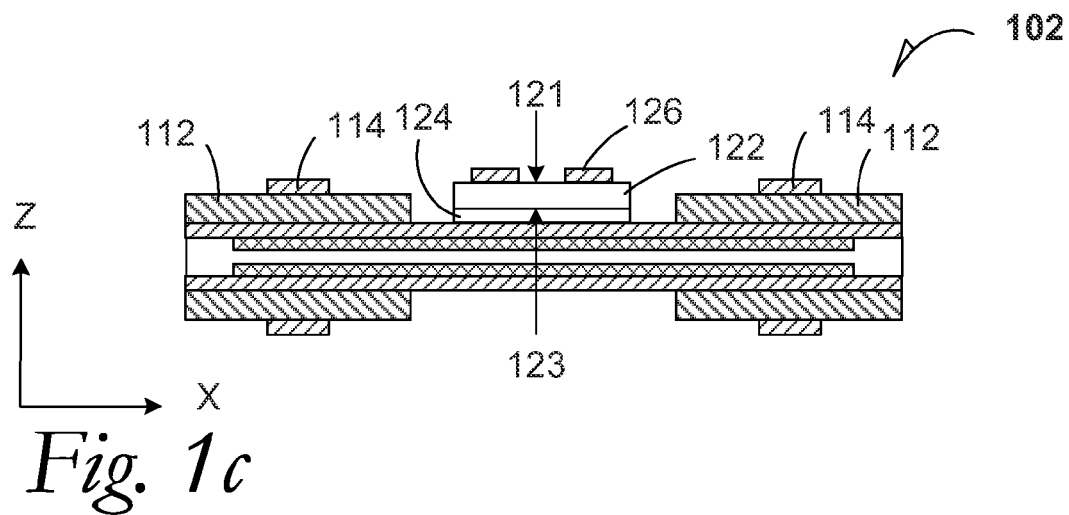
FIG. 1c is a cross-section elevation of the apparatus depicted in FIG. 1b after further processing according to an embodiment.

FIG. 1c is a cross-section elevation of the apparatus depicted in FIG. 1b after further processing according to an embodiment. The apparatus 102 has been further processed by placing a die 122 upon a die adhesive 124 and onto the etch-stop layer 110. In an embodiment, the etch-stop layer 110 is a nickel foil. In an embodiment, the etch-stop layer 110 is an organic material. Other materials may be used for the etch-stop layer 110 depending upon a specific application. The die 122 has a plurality of die bond pads, one of which is indicated with reference numeral 126. The die 122 has an active surface 121 that is on the same surface as the die bond pads 126. The number of die bond pads 126 is show as only two for illustrative simplicity. The die 122 has a backside surface 123 that is opposite the active surface 121.

Figure 1D:
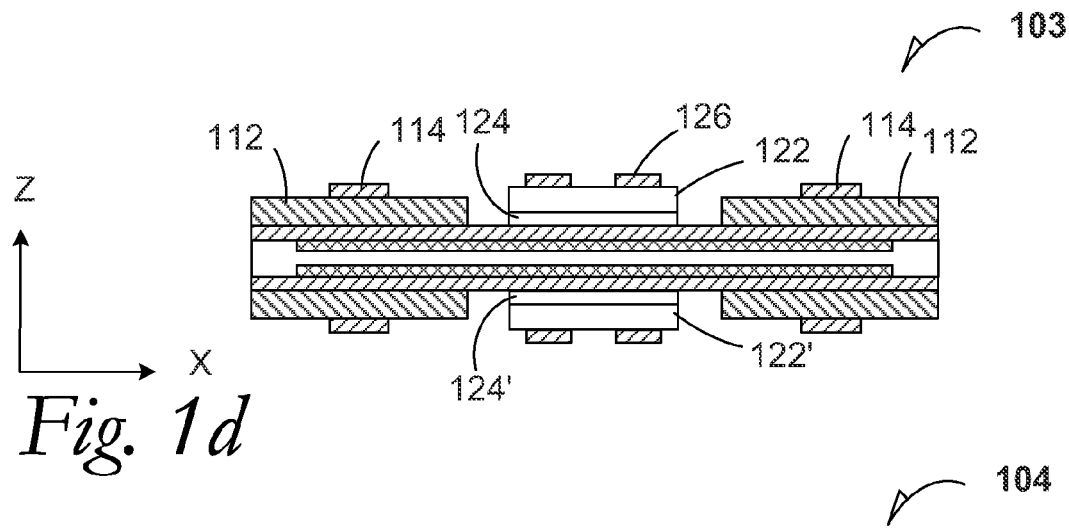
FIG. 1d is a cross-section elevation of the apparatus depicted in FIG. 1c after further processing according to an embodiment.

FIG. 1d is a cross-section elevation of the apparatus depicted in FIG. 1c after further processing according to an embodiment. The apparatus 103 has been further processed by placing a die 122' upon a die adhesive 124' to match the die 122 and die adhesive 124.

Figure 1E:
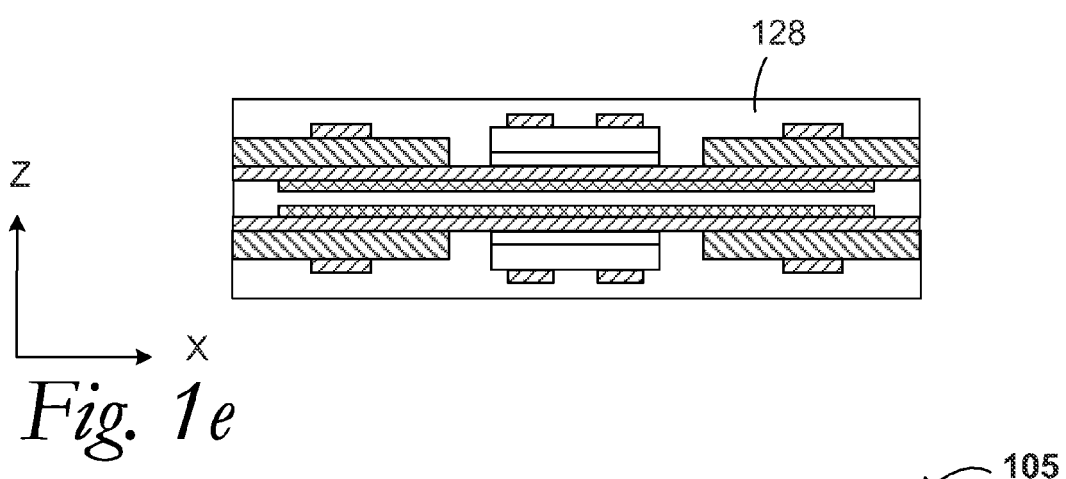
FIG. 1e is a cross-section elevation of the apparatus depicted in FIG. 1d after further processing according to an embodiment.

FIG. 1e is a cross-section elevation of the apparatus depicted in FIG. 1d after further processing according to an embodiment. The apparatus 104 has been processed to receive a first dielectric 128. In an embodiment, the first dielectric 128 is patterned such as by spinning on and curing a liquid dielectric upon a wafer-scale array of apparatus of which the apparatus 104 is merely a subset for illustrative simplicity. In an embodiment, the first dielectric 128 is patterned such as by laminating and curing a b-staged film dielectric upon a wafer-scale array of apparatus of which the apparatus 104 is merely a subset for illustrative simplicity.

Figure 1F:
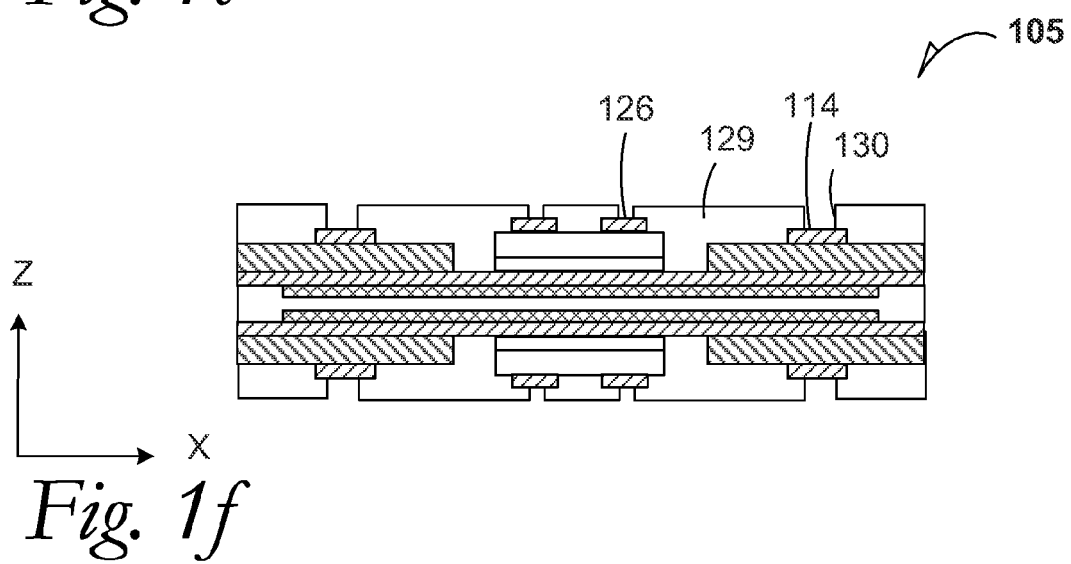
FIG. 1f is a cross-section elevation of the apparatus depicted in FIG. 1e after further processing according to an embodiment.

FIG. 1f is a cross-section elevation of the apparatus depicted in FIG. 1e after further processing according to an embodiment. The apparatus 105 has been processed such that the first dielectric 128, depicted in FIG. 1e, has been patterned to form a patterned first dielectric 129 and several recesses have been formed therein, one of which is indicated with reference numeral 130. The recesses 130 expose both the contact pad 114 and the die bond pad 126.

Figure 1G:
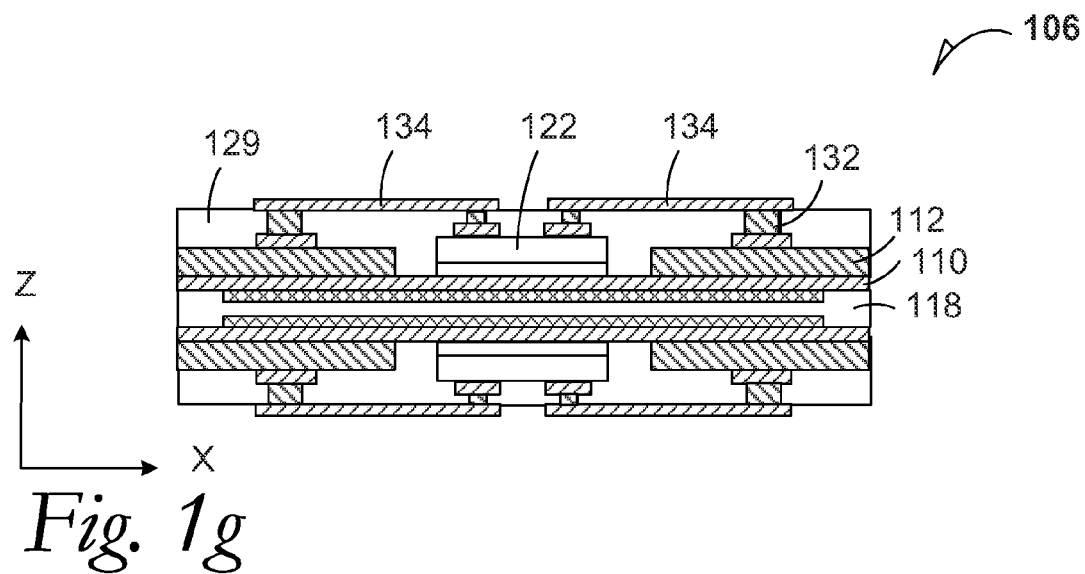
FIG. 1g is a cross-section elevation of the apparatus depicted in FIG. 1f after further processing according to an embodiment.

FIG. 1g is a cross-section elevation of the apparatus depicted in FIG. 1f after further processing according to an embodiment. The apparatus 106 has been processed such that first contacts 132 fill the vias 130 (FIG. 1f) and traces 134 couple the die 122 to the copper connector pad 112. In an embodiment, the first contacts 132 are copper and the several contact pads 114 and die bond pads 126 are also copper. In an embodiment, other metals may be selected for the first contacts 132.

Figure 1H:
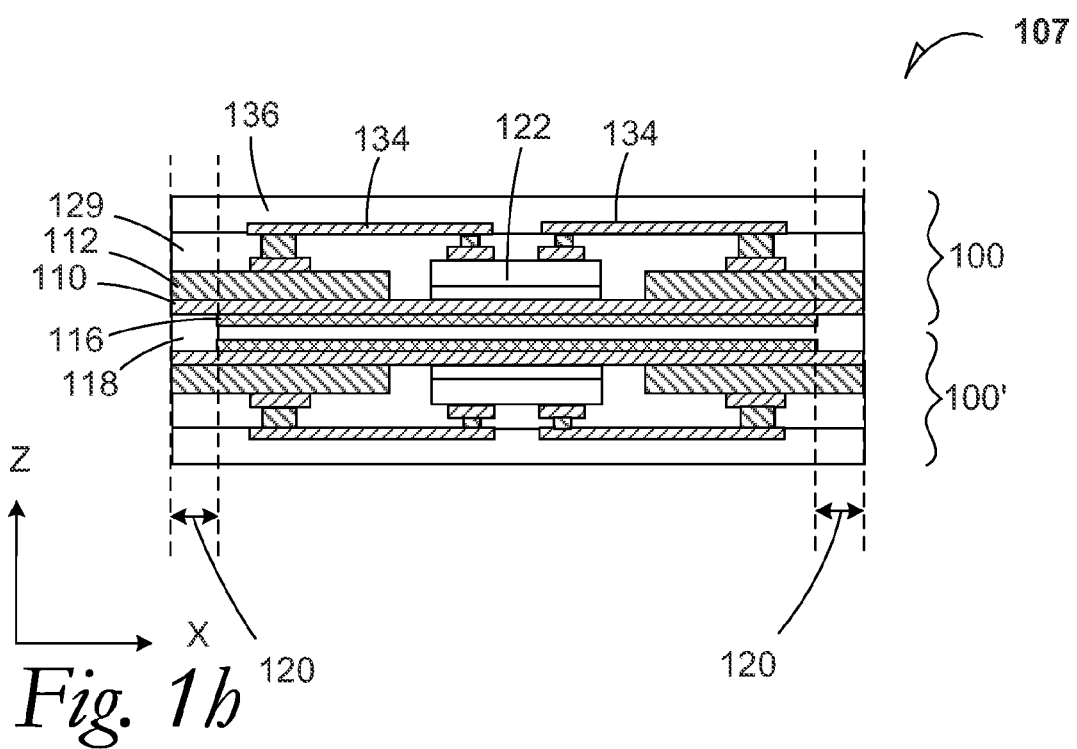
FIG. 1h is a cross-section elevation of the apparatus depicted in FIG. 1g after further processing according to an embodiment.

FIG. 1h is a cross-section elevation of the apparatus depicted in FIG. 1g after further processing according to an embodiment. The apparatus 107 has been processed with a second dielectric 136 such that the patterned first dielectric 129 and the traces 134 are enclosed. Processing of the second dielectric 136 is done by spinning on and curing according to an example embodiment, and it may be done with a wafer-scale array. Processing of the second dielectric 136 is done by laminating and curing according to an example embodiment, and it may be done with a panel-scale array. As configured in FIG. 1h, the two apparatus may be singulated by removing material within the cutting zone 120. With the cutting zone 120 removed, the adhesion release layers 116 allow the two apparatus to be drawn apart.

Figure 2:
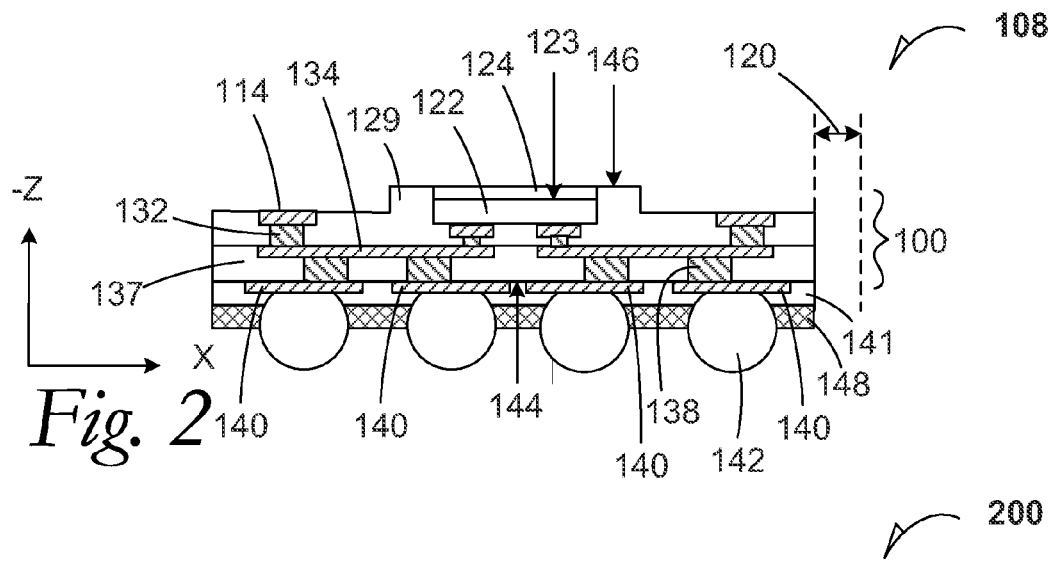
FIG. 2 is a cross-section elevation of the apparatus depicted in FIG. 1h after further processing according to an embodiment.

FIG. 2 is a cross-section elevation of the apparatus depicted in FIG. 1h after further processing according to an embodiment. The apparatus 108 includes the original apparatus 100 depicted in FIG. 1b after it has been inverted and separated from the original apparatus 100'.

The cutting zone 120 is depicted in part such that the margins of the structures are illustrated as having been removed. Consequently, the adhesion release layer 116 (e.g., FIG. 1h) allows the adhesive binder 118 to be removed and separation of the two apparatus 100 and 100' is accomplished.

A removal process has been carried out to eliminate the etch-stop layer 110 and at least some of the copper connector pad 112. Further processing has been carried out such that the second dielectric layer 136, seen in FIG. 1h, has been patterned to form a patterned second dielectric layer 137. Second contacts 138 are filled through the patterned second dielectric layer 137, and bump pads 140 are formed to contact the second contacts 138. The bump pads 140 are processed with a solder resist 141 that forms opens to receive electrical bumps. Further processing includes forming electrical bumps 142 in contact with the bump pads 140.

A ball-grid pad array is located on a first surface 144 of the apparatus 108 and a plurality of four ball pads 140 is illustrated on the first surface 144, and the number is small for illustrative simplicity. It is understood, however, that several more ball pads may be disposed along the X-direction (and along the Y-direction, which is orthogonal to the plane of the FIG.) when ball pitch is spaced on uniform centers. For example where the cross section illustrated intersects the coreless substrate 100 at the die 122, the four ball pads 140 are seen, but where the cross-section might intersect the coreless substrate 100 and not the embedded die 120 such as at an edge of the coreless substrate 100, more ball pads would be intersected. In an embodiment, a ball-pad number along an edge is in a range from 10 to 100. It can now be understood that the mere two illustrated die bond pads 126 may be increased by mapping their number to the number of ball pads 140 for pin-out applications.

It can now be seen that a ball-grid pad array includes the bump pads 140. The surface made by the patterned second dielectric layer 137 may be referred to as the first surface 144. The die 122 may now be referred to as an embedded die 122 in a coreless substrate 100. The embedded die 122 is exposed at a second surface 146 of the coreless substrate 100.

Although the die adhesive 124 is illustrated in FIG. 2, the embedded die 122 may be exposed if the die adhesive 124 has been removed. Hereinafter, the embedded die 122 may be considered to be exposed at a backside surface 123 thereof whether the die adhesive 124 has been removed or not.

After forming the bumps 142 on the ball-grid pad array 140, at least one stiffener layer is formed according to an embodiment. In FIG. 2, the at least one stiffener layer 148 is in contact with the first surface 144. As positioned, the at least one stiffener layer 148 may be referred to as a lower stiffener layer 148 that is in contact with the first surface 144. The apparatus including the first- and second dielectric layers 129 and 137 have a collective first stiffness, and the at least one stiffener layer 148 has a second stiffness that is greater than the first stiffness. Consequently, the at least one stiffener layer 148 imparts a stiffness to the entire apparatus 108 that is useful for further processing as well as for employment of the apparatus in the field when it is installed into a larger system. In an embodiment, the total thickness in the Z-direction for the apparatus 108 is in a range from 40 μm to 200 μm.

In an embodiment, the at least one stiffener layer is a mold compound material such as that used in underflow processing for flip-chip packages. In an embodiment, the at least one stiffener layer is a mold compound material that is used in overmolding processing for chip packages. In an embodiment, the at least one stiffener layer is a prepreg material such as that used in forming printed wiring boards. In any event, the at least one stiffener layer provides a second stiffness that is greater than the composite stiffness of the coreless substrate without an at least one stiffener. In an embodiment, the at least one stiffener layer is formed by a compression molding process. In an embodiment, the at least one stiffener layer is formed by a transfer molding process. In an embodiment, the at least one stiffener layer is formed by a prepreg lamination process.

The apparatus 108 is depicted in simplified form for illustrative purposes. The solder resist layer 141 is depicted to be substantially similar to the at least one stiffener layer 148 in form factor. In an embodiment, the at least one stiffener layer 148 is formed and patterned upon the first surface 144 including over the ball-grid pad array 140 with openings to accept the bumps 142. Consequently, the at least one stiffener layer 148 doubles as a stiffener layer and as a solder resist layer. This embodiment allows for a smaller form factor in the Z-direction. Hereinafter, where the solder resist layer 141 is not illustrated for simplicity, it may be present in every described, illustrated, and claimed embodiment unless explicitly excluded.

It can be seen that the metallizations that support the embedded die 122 are part of a bumpless build-up layer (BBUL) package. Consequently, the apparatus 108 may be referred to as a stiffened BBUL coreless (BBUL-C) package in a coreless substrate 100. Manufacture of the embedded-die coreless-substrate apparatus 108 may be done by a BBUL-C process. In a BBUL-C process embodiment, the embedded die 122 is first seated with the backside surface in a material such as a cavity-containing copper foil, and a build-up layer is manufactured that includes coupling the metallizations to the active surface, and followed by removing the material to expose the backside surface as illustrated. An embedded-die BBUL-C embodiment results. In an embodiment, flatness is maintained by use of the at least one stiffener layer. In an example embodiment, a apparatus 108 is 40 mm along the X-direction and the at least one stiffener deviates from flatness at the first surface 144 by 0.1 micrometer (μm) or less.

Figure 2A:
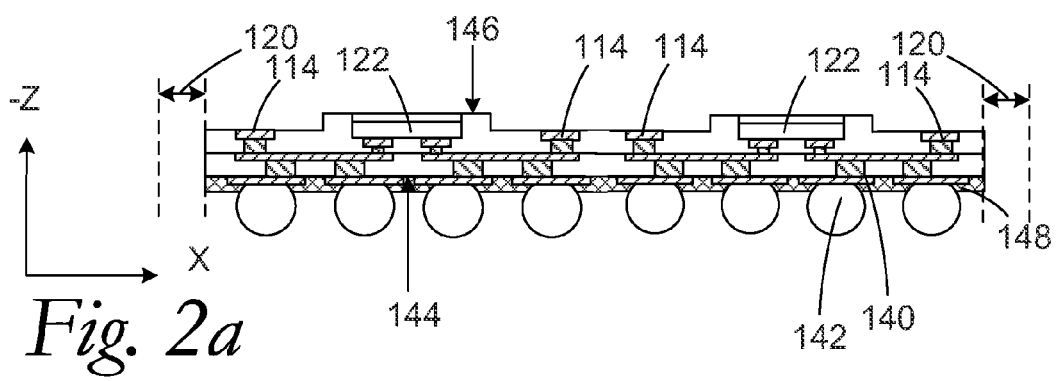
FIG. 2a is a cross-section elevation of an embedded-die coreless substrate apparatus according to an embodiment.

FIG. 2a is a cross-section elevation of a stiffener-strengthened apparatus 200 according to an example embodiment. The apparatus 200 includes a first die and a second die each of which are designated with the numeral 122. The first die and second die 122 are spaced apart in the X-direction. It may also be understood that a first die 122 and a subsequent die may be spaced apart in the Y-direction, which is orthogonal to the plane of the illustration. The first- and second dice 122 are depicted to be embedded and integral to the coreless substrate and to have identical form factors. Further as illustrated, the first and second dice 122 have at least one identical coordinate (such as the Z-direction) and alternatively one more identical coordinate (such as the Y-direction).

The cutting zone 120 is depicted such that the margins of the structures have been removed and it can be seen that structures such as etch-stop layers extend beyond a single embedded die. The adhesion release layer 116 (e.g., FIG. 1h) allows the adhesive binder 118 to be removed and separation of the two apparatus is accomplished.

A ball-grid pad array is located on the first surface 144 and a plurality of eight ball pads 140 is illustrated on the first surface 144, but the number is small for illustrative simplicity, but it is understood that several more ball pads may be disposed along the X-direction (and along the Y-direction, which is orthogonal to the plane of the FIG.) when ball pitch is spaced on uniform centers. For example where the cross section illustrated intersects the coreless substrate at the embedded die 122, the eight ball pads 140 are seen, but where the cross-section might intersect the coreless substrate and not the embedded die 122 such as at an edge of the coreless substrate, more ball pads would be intersected. In an embodiment, a ball-pad number along an edge is in a range from 10 to 100. It can now be seen that a ball-grid pad array includes the bump pads 140. The surface made by the patterned second dielectric layer 137 may be referred to as the first surface 144. The dice 122 may now be referred to as embedded dice 122 in a coreless substrate. After forming the bumps 142 on the ball-grid pad array 140, at least one stiffener layer is formed according to an embodiment. In FIG. 2a, the at least one stiffener layer 148 is in contact with the first surface 144 or it may be spaced apart with a solder resist similarly to the illustration set forth in FIG. 2. As positioned, the at least one stiffener layer 148 may be referred to as a lower stiffener layer 148 that is in contact with the first surface 144. The apparatus including the first- and second dielectrics 129 and 137 have a collective first stiffness, and the at least one stiffener layer 148 has a second stiffness that is greater than the first stiffness. Consequently, the at least one stiffener layer 148 imparts a stiffness to the entire apparatus 200 that is useful for further processing as well as for employment of the apparatus in the field when it is installed into a larger system. In an embodiment, the total thickness in the Z-direction for the apparatus 200 is in a range from 40 μm to 200 μm.

It may now be understood that the embedded first- and second dice 122 may be part of a plurality of dice that equals four. In an embodiment, the form factor may be rectangular as seen in FIG. 2a with a total of two dice. In an embodiment, the form factor may be square with four dice. For example, one die may be a processor die, one may be a solid-state memory die, one die (in the Y-direction, which is orthogonal to the plane of the illustration) may be a radio-frequency transceiver die, and one die may be a passive device such as an inductor, diode, or capacitor. In any event, a system-in-package (SiP) apparatus may be achieved in the apparatus 200.

The apparatus 200 is depicted in simplified form for illustrative purposes. It can be seen that the metallizations that support the embedded dice 122 are part of a BBUL package. Consequently, the apparatus 200 may be referred to as a stiffened BBUL-C package in a coreless substrate.

Figure 3:
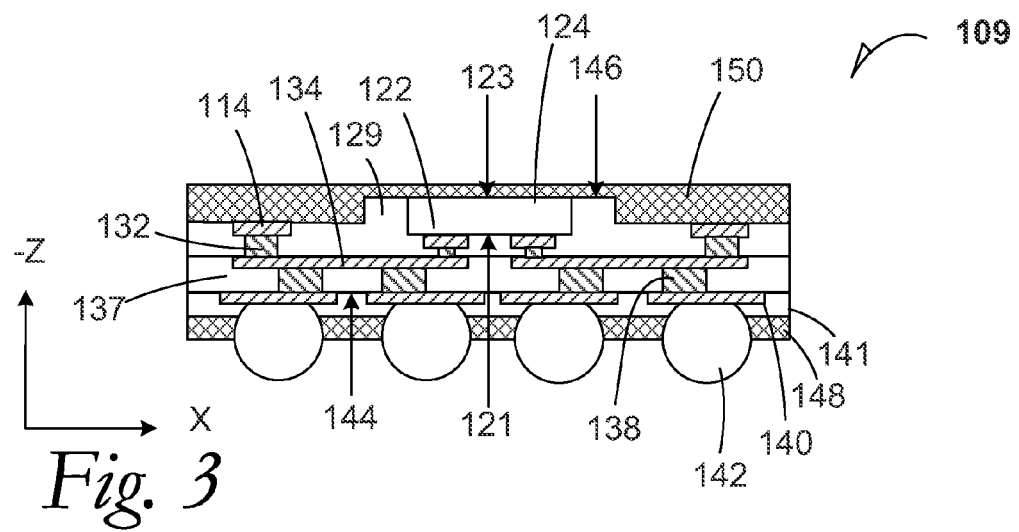
FIG. 3 is a cross-section elevation of the apparatus depicted in FIG. 1h after further processing according to an embodiment.

FIG. 3 is a cross-section elevation of the apparatus depicted in FIG. 1h after further processing according to an embodiment. The apparatus 109 includes a second stiffener layer 150 that is a die-level stiffener disposed on the second surface 146. Further, the second stiffener layer 150 may be referred to as a die-level stiffener layer that is in contact with—and in part parallel planar to the embedded die 122 at its backside surface (which may be item 124 if present).

In an embodiment, the first stiffener layer 148 is not present but the second stiffener layer 150 is present. In this embodiment, the at least one stiffener layer 150 still provides a second stiffness that is greater than the first stiffness. The at least one stiffener layer 150 may be referred to as a die-level stiffener 150. It can be seen that no die adhesive is present on the die backside surface 123 in this embodiment, but it may present be depending upon a given application need. It can also be seen that the die-level stiffener 150 is in contact with—and in part parallel planar to the die backside surface 123 of the embedded die 122. Where two stiffeners are present as illustrated, the first stiffener 148 may be referred to as a lower stiffener layer 148 relative to a die-level or upper stiffener layer 150. In an embodiment, the total thickness in the Z-direction for the apparatus 109 is in a range from 40 μm to 200 μm.

It may now be understood that one stiffener layer may be made of one material embodiment, and one additional stiffener may be made of a different material embodiment. In an example embodiment, the die-level stiffener layer 150 is a mold compound material and the first stiffener layer 148 is liquid epoxy-based material.

Figure 4:
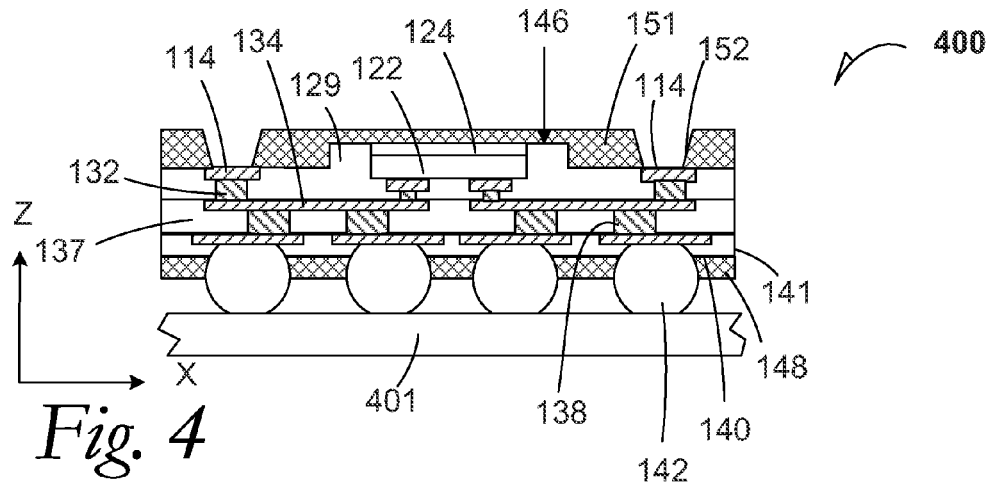
FIG. 4 is a cross-section elevation of the apparatus depicted in FIG. 3 after further processing according to an embodiment.

FIG. 4 is a cross-section elevation of the apparatus depicted in FIG. 3 after further processing according to an embodiment. The apparatus 400 has been processes such that the at least one stiffener 150 depicted in FIG. 3 has been patterned to form a patterned at least one stiffener 151, and recesses 152 have been opened to expose the contact pads 114. As illustrated, the patterned die-level stiffener 151 provides communication recesses 152 such that electrical connection may be made to the embedded die 122. As illustrated, the apparatus 400 may be mounted to a foundation substrate 401 at the bumps 142 where the foundation substrate 401 may be the chassis of a handheld device such as a smart phone.

Further by use of the recesses 152, the apparatus 400 also may accommodated at least one device that can be disposed above and on the patterned die-level at least one stiffener 151. Such devices may include a flip-chip mounted device in an embodiment. Such devices may include a wire-bonded device in an embodiment. Such devices may include a BGA packaged device in an embodiment.

Where at least one device is mounted above and on the at least one patterned die-level stiffener 151, an overmold layer may be formed that protects the at least one device disposed above and on the stiffener 151. In an embodiment, the total thickness in the Z-direction for the apparatus 400 is in a range from 40 μm to 250 μm.

Figure 5:
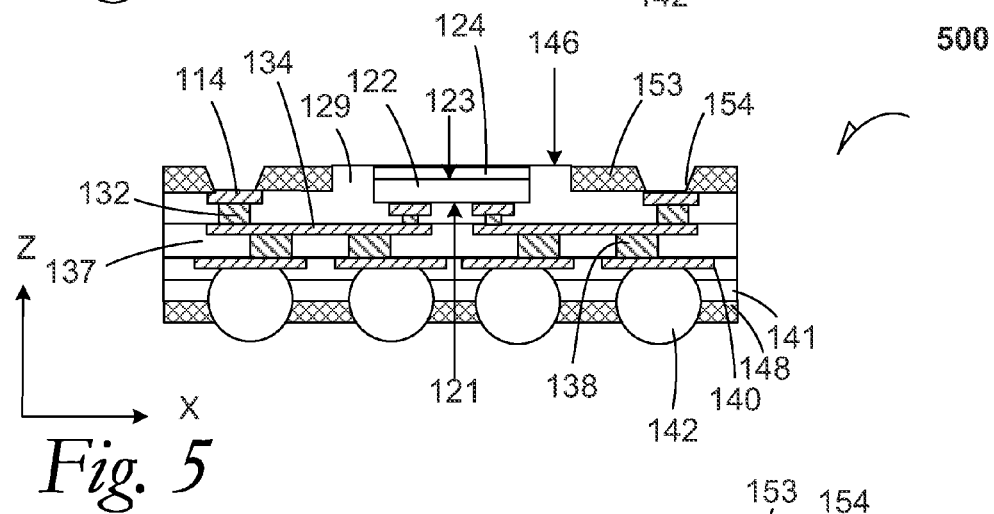
FIG. 5 is a cross-section elevation of the apparatus depicted in FIG. 1h after further processing according to an embodiment.

FIG. 5 is a cross-section elevation of the apparatus depicted in FIG. 2 after further processing according to an embodiment. The apparatus 500 has been processed such that at least one stiffener has been patterned to form a patterned at least one stiffener 153, and recesses 154 have been opened to expose the contact pads 114. Further, the patterned at least one stiffener 153 has a vertical (Z-direction) height that exposes the backside surface 123 of the die 122 or if present the die adhesive 124. This embodiment allows for a thinner form factor compared to the embodiment depicted in FIG. 4, all other things being equal. This embodiment may also allow for the die 122 to be thermally coupled to a heat sink, a heat spreader, or even a top die at the die backside surface 123. In an embodiment, the total thickness in the Z-direction for the apparatus 500 is in a range from 40 μm to 250 μm.

As illustrated, the patterned die-level stiffener 153 provides communication recesses 154 such that electrical connection may be made to the embedded die 122. As illustrated, the apparatus 500 may be mounted to a foundation substrate at the bumps 142 where the foundation substrate may be the chassis of a handheld device such as a smart phone.

Further by use of the recesses 154, the apparatus 500 also may accommodated at least one "top" device that can be disposed above and on the patterned die-level at least one stiffener 153. The device may be referred to as a "top" device when the apparatus is viewed as seen in FIG. 5. Such devices may include a flip-chip mounted device in an embodiment. Such devices may include a wire-bonded device in an embodiment. Such devices may include a passive device in an embodiment. Such devices may include a BGA packaged device in an embodiment.

Where at least one device is mounted above and on the at least one patterned die-level stiffener 153, an overmold layer may be formed that protects the at least one device disposed above and on the stiffener 153.

Figure 6:
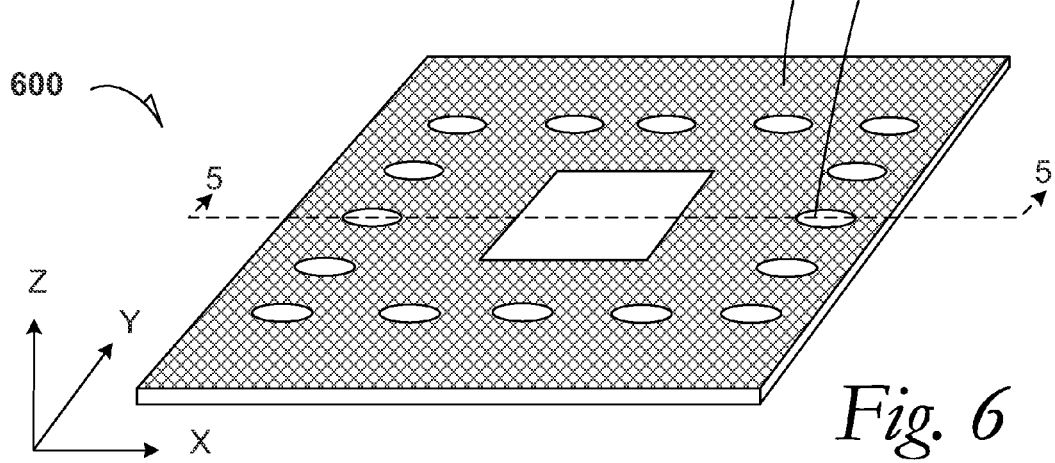
FIG. 6 is a perspective of a portion of the apparatus depicted in FIG. 5 according to an example embodiment.

FIG. 6 is a perspective of a portion of the apparatus depicted in FIG. 5 according to an example embodiment. The patterned die-level stiffener 153 is seen with several communication recesses, one of which is indicated with reference numeral 154. A section line 5-5 shows the portion of FIG. 5 that intersects the die-level stiffener 153. It may be here observed that the patterned die-level stiffener 153 provides a center opening that allows the embedded die to be exposed at the backside surface.

Figure 7:
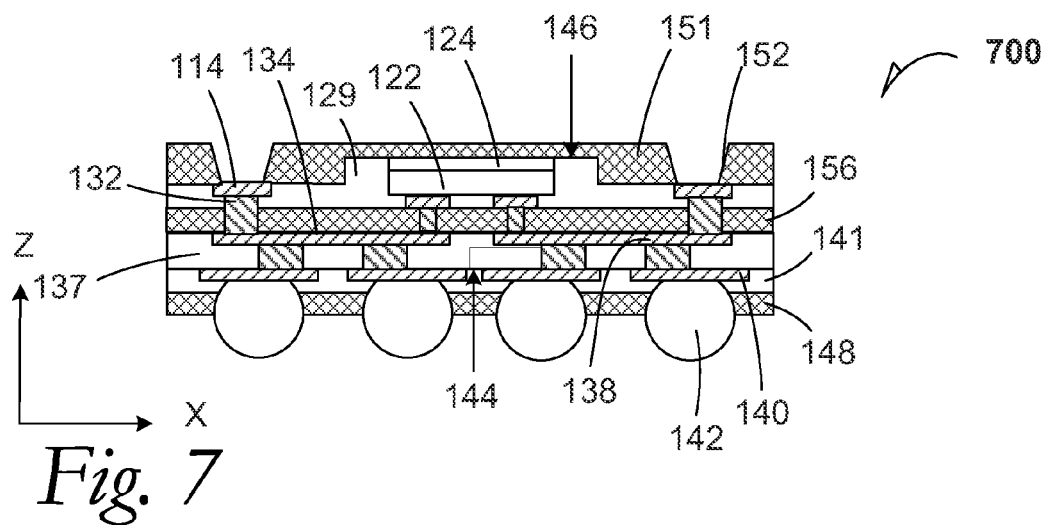
FIG. 7 is a cross-section elevation of an embedded-die coreless substrate apparatus according to an embodiment.

FIG. 7 is a cross-section elevation of a stiffener-strengthened coreless apparatus 700 according to an example embodiment. A middle stiffener layer 156 is depicted that is obscured from each of the first surface 144 and the second surface 146. Placement of the middle stiffener layer 156 is seen to be proximate the die 122. By this placement embodiment, it is understood that "proximate the die" means the middle stiffener layer 156 is closer to the die 122 than to the second surface 144.

In an embodiment in addition to a middle stiffener 156, a die-level stiffener 151 is present. In an embodiment in addition to a middle stiffener 156, a lower level stiffener 148 is present. In an embodiment in addition to a middle stiffener 156, a die-level stiffener 151 and a lower level stiffener 148 are present. In an embodiment, the total thickness in the Z-direction for the apparatus 700 is in a range from 40 μm to 250 μm.

Figure 8:
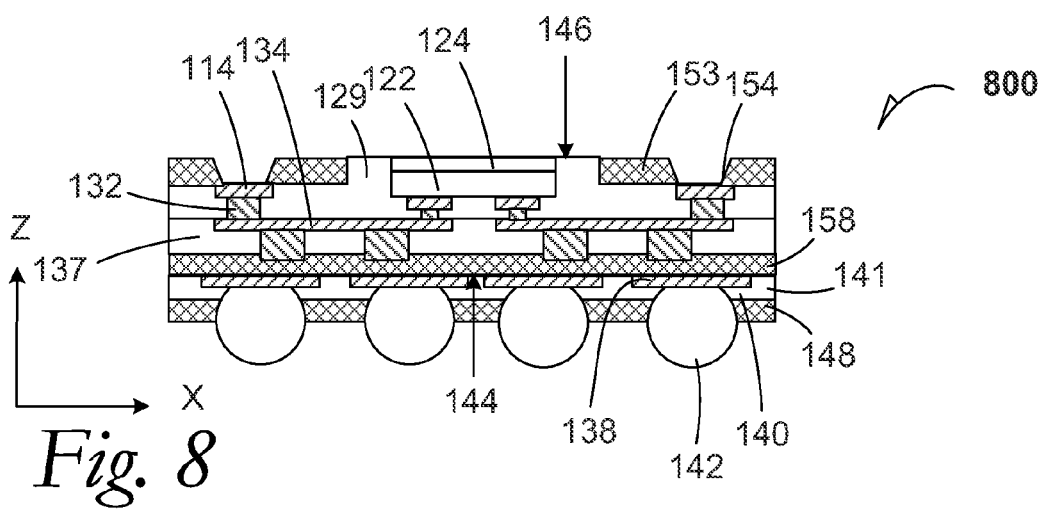
FIG. 8 is a cross-section elevation of an embedded-die coreless substrate apparatus according to an embodiment.

FIG. 8 is a cross-section elevation of a coreless stiffener-strengthened apparatus 800 according to an example embodiment. A middle stiffener layer 158 is depicted that is obscured from each of the first surface 144 and the second surface 146. Placement of the middle stiffener layer 156 is seen to be proximate the second surface 144. By this placement embodiment, it is understood that "proximate the second surface" means the middle stiffener layer 156 is closer to the second surface than to the first surface 146.

In an embodiment in addition to a middle stiffener 158, a die-level stiffener 153 is present. In an embodiment in addition to a middle stiffener 158, a lower level stiffener 148 is present. In an embodiment in addition to a middle stiffener 158, a die-level stiffener 153 and a lower level stiffener 148 are present. In an embodiment, the total thickness in the Z-direction for the apparatus 800 is in a range from 40 μm to 250 μm.

It is now clear from the disclosure that more than one middle stiffener may be employed according to a given application. It is also now clear that more than one middle stiffener may be employed in addition to a lower stiffener according to a given application. It is also now clear that more than one middle stiffener may be employed in addition to a die-level stiffener according to a given application.

Figure 9:
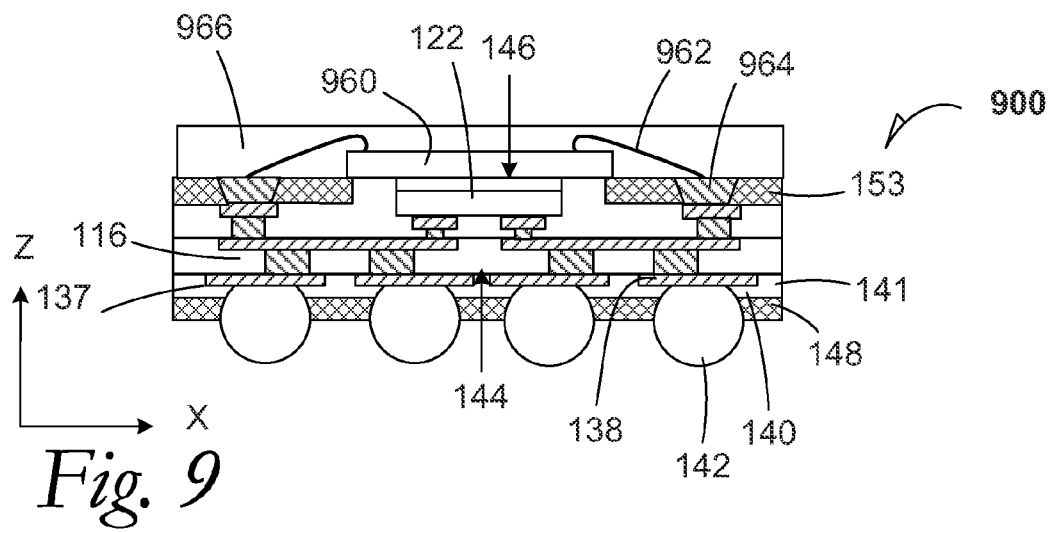
FIG. 9 is a cross-section elevation of an embedded-die coreless substrate apparatus according to an embodiment.

FIG. 9 is a cross-section elevation of a coreless stiffener-strengthened apparatus 900 according to an example embodiment. The apparatus 900 also has at least one device 960 disposed on the second surface 146. In an embodiment, a first device 960 has been wire-bond 962 mounted on the second surface 146. The bond wire 962 communicates to the die 122 through a via 964. It can be seen that the first device 960 is disposed upon the second surface 146, but it may be set upon other structures such as a heat sink that would be located immediately below the first device 960 and above the die 122. In an embodiment, the first device 960 and the die 122 act as mutual heat sinks.

In an embodiment, the at least one device 960 takes up a smaller footprint on the die-level stiffener 153 than illustrated, and the apparatus allows for at least one additional device to be disposed upon the second surface 146. In an embodiment, the at least one device and the one additional device are each active devices. In an embodiment, the at least one device is an active device and one additional device is a passive device. In an embodiment, the at least one device and the one additional device are each passive devices. The via 964 electrically couples the at least one device 960 to conductive structures and articles embedded in the coreless substrate including the die 122. Where the stiffener may be a die-level stiffener, the via is a through-stiffener via.

The apparatus 900 also has an overmold layer 966 that protects the at least one device 960 disposed on the second surface 146. The overmold layer 966 delivers multiple effects including at least protecting the at least one device 960 and providing additional stiffness to the entire apparatus 900.

In an embodiment, the apparatus 900 is assembled to a substrate at the electrical bumps 142 such as to a board for a smart phone or a hand-held electronic device. The substrate may be referred to as a foundation substrate that accepts a stiffened BBUL-C substrate. The first surface 144 thus faces the foundation substrate.

Figure 10:
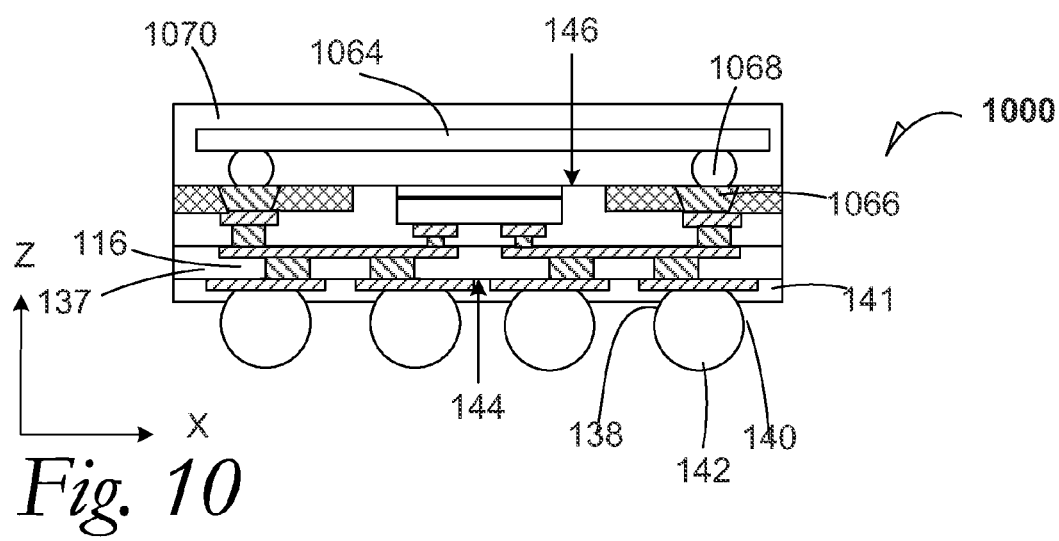
FIG. 10 is a cross-section elevation of an embedded-die coreless substrate apparatus according to an embodiment.

FIG. 10 is a cross-section elevation of a coreless stiffener-strengthened apparatus 1000 according to an example embodiment. The apparatus 1000 also has at least one device 1064 that is flip-chip disposed on the second surface 146 and coupled to a via 1066 by a ball contact 1068. In an embodiment, the first device 1064 has been wire-bond mounted on the second surface 146. It can be seen that the first device 1064 is disposed upon the second surface 146. In an embodiment, the first device 1064 and the die 122 act as mutual heat sinks.

In an embodiment, the at least one device 1064 takes up a smaller footprint on the die-level stiffener 153 than illustrated, and the apparatus allows for at least one additional device to be disposed upon the second surface 146. In an embodiment, the at least one device and the one additional device are each active devices. In an embodiment, the at least one device is an active device and one additional device is a passive device. In an embodiment, the at least one device and the one additional device are each passive devices The apparatus 1000 also has an overmold layer 1070 that protects the at least one device 1064 disposed on the second surface 146. The overmold layer 1070 delivers multiple effects including at least protection of the at least one device 1064 and providing additional stiffness to the entire apparatus 1000.

In an embodiment, the apparatus is assembled to a substrate at the electrical bumps 142 such as to a board for a smart phone or a hand-held electronic device. The substrate may be referred to as a foundation substrate that accepts a stiffened BBUL-C substrate. The first surface 144 thus faces the foundation substrate. Other devices may be disposed on the second surface 146 such as passive devices that support the active device 1064.

Figure 11:
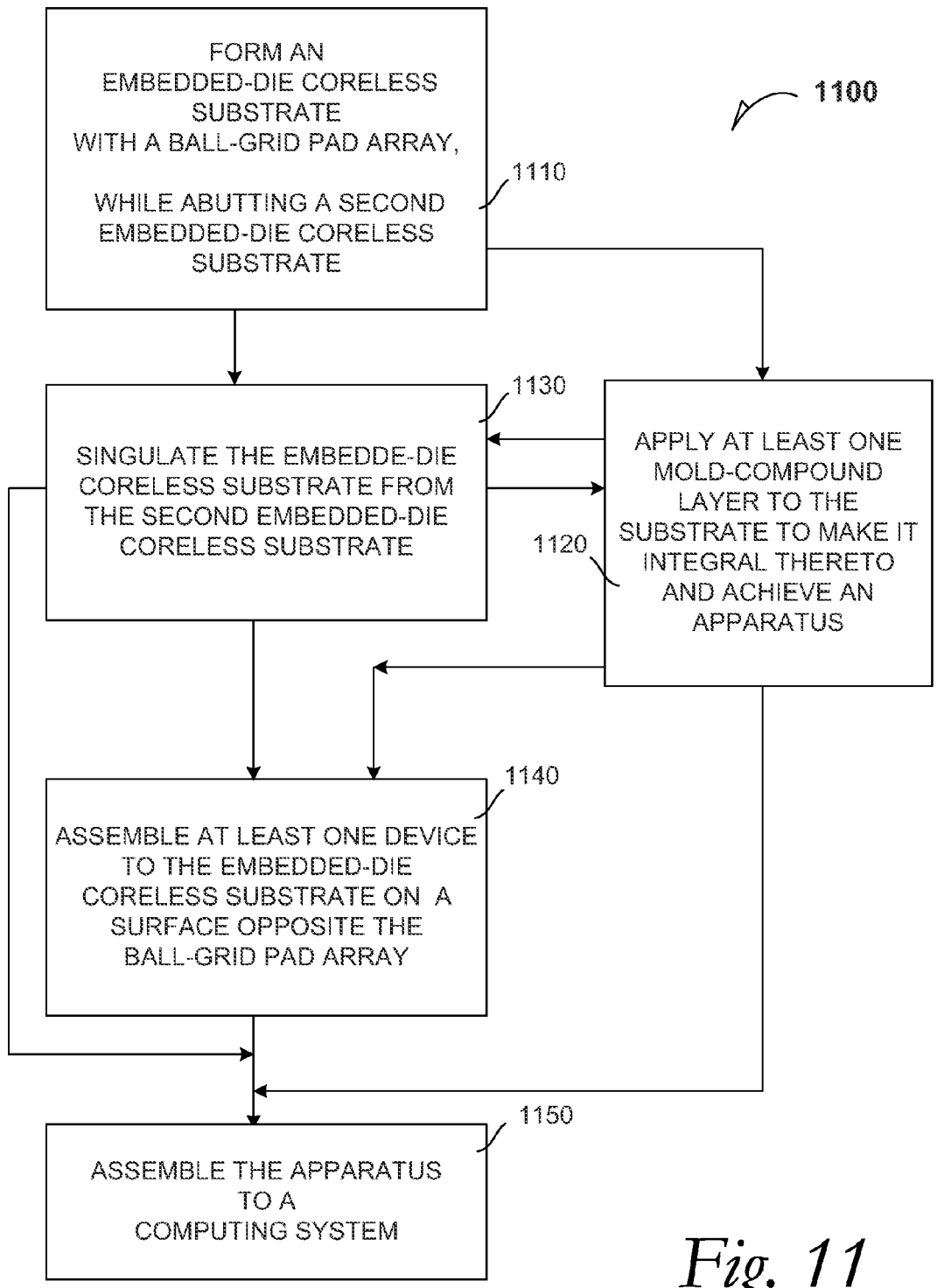
FIG. 11 is a process and method flow diagram according to an example embodiment.

FIG. 11 is a process and method flow diagram 1100 according to several embodiments.

At 1110, the method includes forming an embedded-die coreless substrate with a ball-grid pad array, while abutting with a second embedded-die coreless substrate. In a non-limiting example embodiment, the embedded-die coreless substrate apparatus 107 as seen in FIG. 1h is formed.

At 1120, the process includes applying at least one mold-compound layer to the substrate to make it integral thereto and to achieve an apparatus. In a non-limiting example embodiment, the apparatus 108 depicted in FIG. 2 is achieved by applying the mold-compound layer 148 to the first surface 144. It may now be understood that a prepreg layer may be used in place of the mold compound layer in an embodiment, and when applied to any of the disclosed embodiments.

In a non-limiting example embodiment, the apparatus 700 depicted in FIG. 7 is achieved by applying the mold-compound layer 156 to interior surfaces of the coreless substrate during buildup. In an embodiment, the process commences and terminates at 1120.

At 1130, the process includes singulating the embedded-die coreless substrate from the second embedded-die coreless substrate. In a non-limiting example embodiment, the process commences at 1120 and terminates at 1130.

At 1140, the process includes assembling at least one device to the embedded-die coreless substrate on a surface opposite the ball-grid pad array. In a non-limiting example embodiment, the device 960 depicted in FIG. 9 is assembled upon the second surface 146.

At 1150, the process includes assembling the apparatus to a computing system. In a non-limiting example embodiment, a foundation substrate is part of a computing system and it is assembled with the apparatus at the electrical bumps 142.

Figure 12:
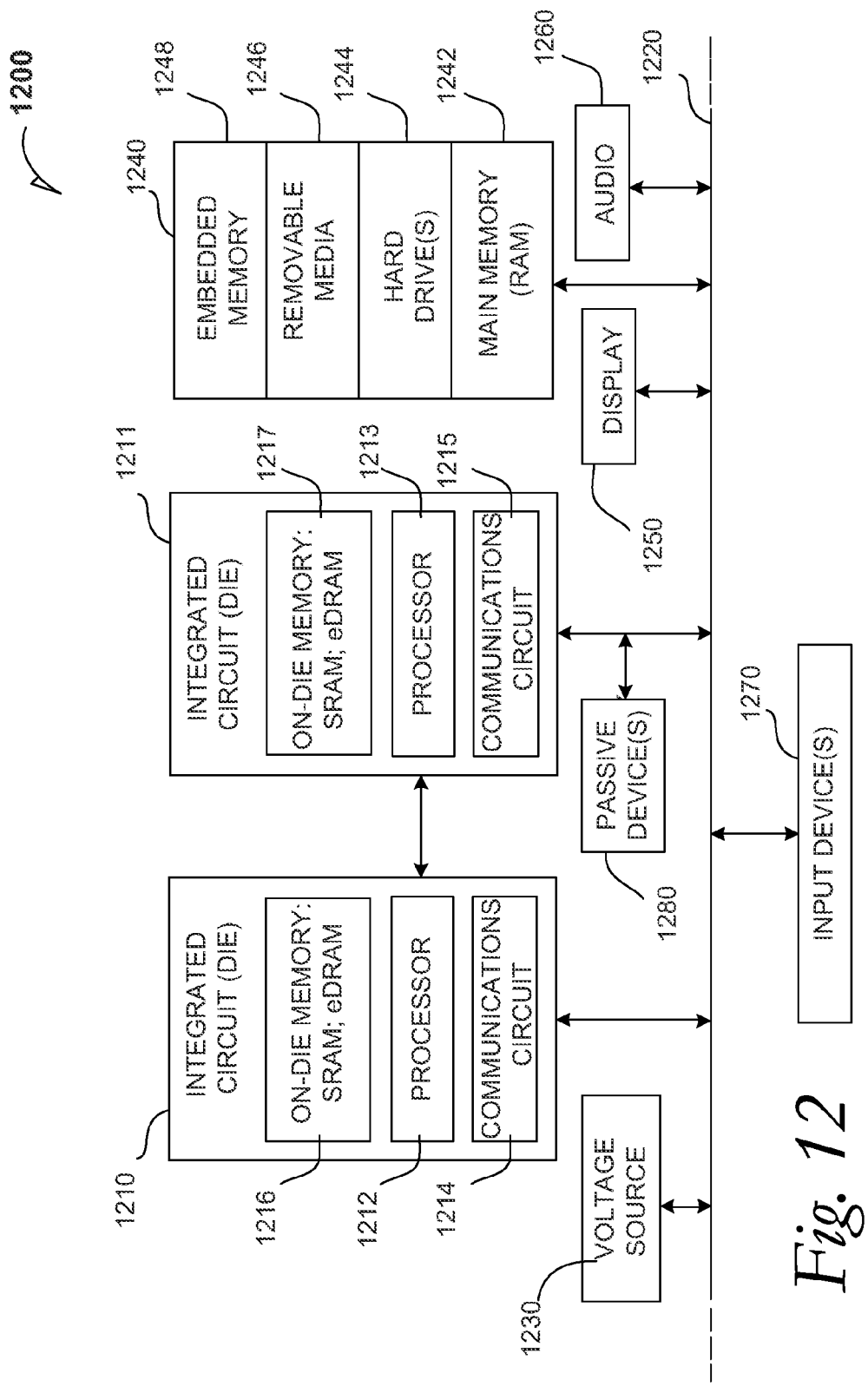
FIG. 12 is a schematic of a computer system according to an embodiment.

FIG. 12 is a schematic of a computer system 1200 according to an embodiment. The computer system 1200 (also referred to as the electronic system 1200) as depicted can embody an embedded-die BBUL-C substrate that is stiffened with at least one stiffener layer including one of a mold-compound layer or a prepreg layer according to any of the several disclosed embodiments and their equivalents as set forth in this disclosure. The computer system 1200 may be a mobile device such as a netbook computer. The computer system 1200 may be a mobile device such as a wireless smart phone.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 may mean any type of circuit such as, but not limited to, a microprocessor, a microcontroller, a graphics processor, a digital signal processor, or another processor. In an embodiment, the processor 1212 is the embedded die disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems. In an embodiment, the processor 1210 includes on-die memory 1216 such as static random-access memory (SRAM). In an embodiment, the processor 1210 includes embedded on-die memory 1216 such as embedded dynamic random-access memory (eDRAM).

In an embodiment, the integrated circuit 1210 is complemented with a subsequent integrated circuit 1211 such as an embedded subsequent die embodiment. The dual integrated circuit 1211 may include a second die such as the second die 122 depicted in FIG. 2a. The dual integrated circuit 1211 may include a device such as the device 1064 depicted in FIG. 1000. Useful embodiments include a dual processor 1213 and a dual communications circuit 1215 and dual on-die memory 1217 such as SRAM. In an embodiment, the dual integrated circuit 1210 includes embedded on-die memory 1217 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. The external memory 1240 may also be embedded memory 1248 such as a flip-chip mounted device on the BBUL-C second surface 146 according to an embodiment.

In an embodiment, the electronic system 1200 also includes a display device 1250, an audio output 1260. In an embodiment, the electronic system 1200 includes an input device such as a controller 1270 that may be a keyboard, mouse, trackball, game controller, microphone, voice-recognition device, or any other input device that inputs information into the electronic system 1200. In an embodiment, an input device 1270 is a camera. In an embodiment, an input device 1270 is a digital sound recorder. In an embodiment, an input device 1270 is a camera and a digital sound recorder.

As shown herein, the integrated circuit 1210 can be implemented in a number of different embodiments, including embedded-die BBUL-C substrate that is stiffened with at least one stiffener layer including one of a mold-compound layer or a prepreg according to any of the several disclosed embodiments and their equivalents, an electronic system, a computer system, one or more methods of fabricating an integrated circuit, and one or more methods of fabricating an electronic assembly that includes an embedded-die BBUL-C substrate that is stiffened with at least one stiffener layer including one of a mold-compound layer or a prepreg layer according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embedded-die BBUL-C substrate that is stiffened with at least one stiffener layer including one of a mold-compound layer or a prepreg layer embodiments and their equivalents.

Although an embedded die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus, comprising:
    a coreless substrate including a first surface and a second surface, wherein the coreless substrate includes interlayer dielectric materials of a first stiffness;
    a ball-grid pad array disposed on the first surface;
    an embedded die that is integral to the coreless substrate; and
    at least one stiffener layer of a second stiffness and that is integral to the coreless substrate, wherein the second stiffness is greater than the first stiffness.

2. The apparatus of claim 1, wherein the embedded die is an embedded first die, the apparatus further including an embedded subsequent die that is integral to the coreless substrate.

3. The apparatus of claim 1, wherein the at least one stiffener layer is in contact with the first surface.

4. The apparatus of claim 1, wherein the at least one stiffener layer includes a lower stiffener layer that is in contact with the first surface, the apparatus further including a die-level stiffener layer that is in contact with—and in part parallel planar to the embedded die backside Surface.

5. The apparatus of claim 1, wherein the at least one stiffener layer includes a lower stiffener layer that is in contact with the first surface, the apparatus further including a die-level stiffener layer that in contact with—and parallel planar to the embedded die backside surface, and wherein the die backside surface is exposed through the die-level stiffener layer.

6. The apparatus of claim 1, wherein the embedded die is exposed through the coreless substrate at the second surface, wherein the at least one stiffener layer includes a lower stiffener layer in contact with the first surface, further including a middle stiffener layer that is obscured from each of the first surface and the second surface.

7. The apparatus of claim 1, wherein the embedded die is exposed through the coreless substrate at the second surface, wherein the at least one stiffener layer includes:
    a lower stiffener layer in contact with the first surface;
    a middle stiffener layer that is obscured from each of the first surface and the second surface; and
    a die-level stiffener layer that is in contact with—and in part parallel planar to the embedded die backside surface.

8. The apparatus of claim 1, wherein the embedded die includes an active surface and a backside surface, and wherein the at least one stiffener layer is in contact with—and in part parallel planar to the embedded die backside surface.

9. The apparatus of claim 1, wherein the embedded die includes an active surface and a backside surface, wherein the at least one stiffener layer is in contact with—and parallel planar to the embedded die backside surface, and wherein the die backside surface is exposed through the at least one stiffener layer.

10. The apparatus of claim 1, wherein the embedded die is exposed through the coreless substrate at a first surface thereof, wherein the ball-grid pad array is at a second surface thereof that is parallel planar with the first surface, and wherein the least one stiffener layer is in obscured from each of the first surface and the second surface.

11. The apparatus of claim 1, wherein the embedded die is exposed through the coreless substrate at a first surface thereof, wherein the ball-grid pad array is at a second surface thereof that is parallel planar with the first surface, the apparatus further including:
    the at least one stiffener layer includes a lower stiffener layer that is in contact with—and intersecting a plane that includes the ball-grid pad array;
    a die-level stiffener layer in contact with—and parallel planar to the embedded die backside surface, and wherein the die backside surface is exposed through the die-level stiffener layer; and
    a middle stiffener that is obscured from each of the first surface and the second surface.

12. The apparatus of claim 1, wherein the at least one stiffener layer is a mold compound material.

13. The apparatus of claim 1, wherein the at least one stiffener layer is an underfill compound material.

14. The apparatus of claim 1, wherein the at least one stiffener layer is a prepreg material.

15. A process comprising:
applying at least one stiffener layer to an embedded-die coreless substrate to make the at least one stiffener layer integral thereto, wherein the embedded-die coreless substrate is abutting a second embedded-die coreless substrate, and wherein the embedded-die coreless substrate includes:
a first surface and a second surface;
interlayer dielectric materials of a first stiffness; a ball-grid pad array disposed on the first surface;
an embedded die that is integral to the coreless substrate; and
wherein the at least one stiffener has a second stiffness that is larger than the first stiffness; and
singulating the embedded-die coreless substrate from the second substrate.

16. The process of claim 15, wherein the at least one embedded-die coreless substrate is part of a first wafer-scale array of embedded-die coreless substrates that is abutting the second embedded-die coreless substrate in a second wafer-scale array of embedded-die coreless substrates.

17. The process of claim 15, wherein applying the at least one stiffener layer to the embedded-die coreless substrate includes applying the stiffener at the first surface, wherein the first surface includes a ball-grid pad array.

18. The process of claim 15, wherein applying the at least one stiffener layer to the embedded-die coreless substrate includes applying the stiffener at the first surface, wherein the first surface includes a ball-grid pad array, further including applying a second stiffener to the embedded-die coreless substrate.

19. The process of claim 15, wherein applying the at least one stiffener layer to the embedded-die coreless substrate includes applying the stiffener at the first surface, wherein the first surface includes a ball-grid pad array, further including applying a second stiffener to the embedded-die coreless substrate, and wherein the at least one stiffener is a mold compound material the second stiffener is a prepreg material.

20. The process of claim 15, wherein applying the at least one stiffener layer to the embedded-die coreless substrate includes applying the stiffener at the second surface, wherein the stiffener is in contact with—and in part parallel planar to the embedded die at a backside surface thereof.

21. The process of claim 15, wherein applying the at least one stiffener layer to the embedded-die coreless substrate includes applying the stiffener at the second surface, wherein the stiffener is in contact with—and in part parallel planar to the embedded die at a backside surface thereof, further including applying a second stiffener to the embedded-die coreless substrate.

22. The process of claim 15, wherein applying the at least one stiffener layer to the embedded-die coreless substrate includes applying the stiffener at the second surface, wherein the stiffener is in contact with—and in part parallel planar to the embedded die at a backside surface thereof, further including applying a second stiffener to the embedded-die coreless substrate, and wherein the at least one stiffener is a mold compound material the second stiffener is a prepreg material.

23. The process of claim 15, wherein applying the at least one stiffener layer to the embedded-die coreless substrate includes applying the stiffener to be obscured from each of the first surface and the second surface.

24. The process of claim 15, wherein applying the at least one stiffener layer to the embedded-die coreless substrate includes applying the stiffener to be obscured from each of the first surface and the second surface, further including applying a second stiffener to the embedded-die coreless substrate.

25. The process of claim 15, wherein applying the at least one stiffener layer to the embedded-die coreless substrate includes applying the stiffener to be obscured from each of the first surface and the second surface, further including applying a second stiffener to the embedded-die coreless substrate, and wherein the at least one stiffener is a mold compound material the second stiffener is a prepreg material.

26. A computing system, comprising:
a coreless substrate including a first surface and a second surface, wherein the coreless substrate includes interlayer dielectric materials of a first stiffness;
a ball-grid pad array disposed on the first surface;
an embedded die that is integral to the coreless substrate; and
at least one stiffener layer of a second stiffness and that is integral to the coreless substrate, wherein the second stiffness is greater than the first stiffness; and
a foundation substrate coupled to the coreless substrate.

27. The computing system of claim 26, wherein the at least one device includes a band-pass filter disposed proximate to and coupled to a radio-frequency device.

28. The computing system of claim 26, further including external memory coupled to the embedded die.

29. The computing system of claim 26, wherein the computing system is part of one of a cellular telephone, a pager, a portable computer, a desktop computer, and a two-way radio.

* * * * *

UNITED STATES PATENT AND TRADEMARK OFFICE
CERTIFICATE OF CORRECTION

| | | |
|---|---|---|
| PATENT NO. | : 8,264,849 B2 | Page 1 of 1 |
| APPLICATION NO. | : 12/821847 | |
| DATED | : September 11, 2012 | |
| INVENTOR(S) | : John S. Guzek | |

It is certified that error appears in the above-identified patent and that said Letters Patent is hereby corrected as shown below:

On the Title page, in column 2, in "Primary Examiner", line 1, delete "Michael" and insert -- Michail --, therefor.

On sheet 8 of 9, in Figure 11, Reference Numeral 1130, line 1, delete "EMBEDDE" and insert -- EMBEDDED --, therefor.

In column 12, line 50, in claim 10, delete "the least" and insert -- the at least --, therefor.

Signed and Sealed this
Twenty-seventh Day of November, 2012

David J. Kappos
*Director of the United States Patent and Trademark Office*